United States Patent
Tayebati et al.

(10) Patent No.: US 9,190,807 B2
(45) Date of Patent: Nov. 17, 2015

(54) METHOD FOR IMPROVING PERFORMANCE OF WAVELENGTH BEAM COMBINING DIODE LASER SYSTEMS

(71) Applicant: TeraDiode, Inc., Wilmington, MA (US)

(72) Inventors: Parviz Tayebati, Sherborn, MA (US); Bien Chann, Merrimack, NH (US); Robin Huang, North Billerica, MA (US); Bryan Lochman, Somerville, MA (US); Francisco Villarreal-Saucedo, Middleton, MA (US); James Zambuto, Winchester, MA (US)

(73) Assignee: TeraDiode, Inc., Wilmington, MA (US)

( * ) Notice: Subject to any disclaimer, the term of this patent is extended or adjusted under 35 U.S.C. 154(b) by 0 days.

(21) Appl. No.: 14/572,769

(22) Filed: Dec. 16, 2014

(65) Prior Publication Data

US 2015/0229099 A1    Aug. 13, 2015

Related U.S. Application Data

(60) Provisional application No. 61/916,598, filed on Dec. 16, 2013.

(51) Int. Cl.
| | |
|---|---|
| *H01S 3/13* | (2006.01) |
| *H01S 5/00* | (2006.01) |
| *H01S 5/0687* | (2006.01) |
| *H01S 5/40* | (2006.01) |
| *H01S 5/068* | (2006.01) |
| *H01S 5/0683* | (2006.01) |
| *H01S 5/14* | (2006.01) |

(52) U.S. Cl.
CPC . *H01S 5/005* (2013.01); *H01S 3/13* (2013.01); *H01S 3/1306* (2013.01); *H01S 5/068* (2013.01); *H01S 5/0683* (2013.01); *H01S 5/0687* (2013.01); *H01S 5/14* (2013.01); *H01S 5/141* (2013.01); *H01S 5/4012* (2013.01); *H01S 5/4062* (2013.01); *H01S 5/4087* (2013.01)

(58) Field of Classification Search
CPC ... H01S 5/4012; H01S 5/4062; H01S 5/4087; H01S 5/068; H01S 5/0683; H01S 5/141; H01S 5/14; H01S 3/1306; H01S 3/13
USPC .......... 372/31, 29.02, 102, 98, 50.12
See application file for complete search history.

(56) References Cited

U.S. PATENT DOCUMENTS

| | | | |
|---|---|---|---|
| 6,526,079 B1 * | 2/2003 | Watterson et al. | 372/32 |
| 8,526,110 B1 * | 9/2013 | Honea et al. | 359/556 |
| 2005/0169581 A1 * | 8/2005 | Downing et al. | 385/39 |
| 2011/0216792 A1 * | 9/2011 | Chann et al. | 372/31 |
| 2011/0305256 A1 * | 12/2011 | Chann et al. | 372/75 |

* cited by examiner

*Primary Examiner* — Kinam Park
(74) *Attorney, Agent, or Firm* — Morgan, Lewis & Bockius LLP

(57) ABSTRACT

A method for optimizing startup time and efficiency for a WBC laser diode system having numerous diode elements, wherein each diode element is measured, an optimal band region is determined for each diode element, and placed in an optimal placement within an array of diode elements.

21 Claims, 12 Drawing Sheets

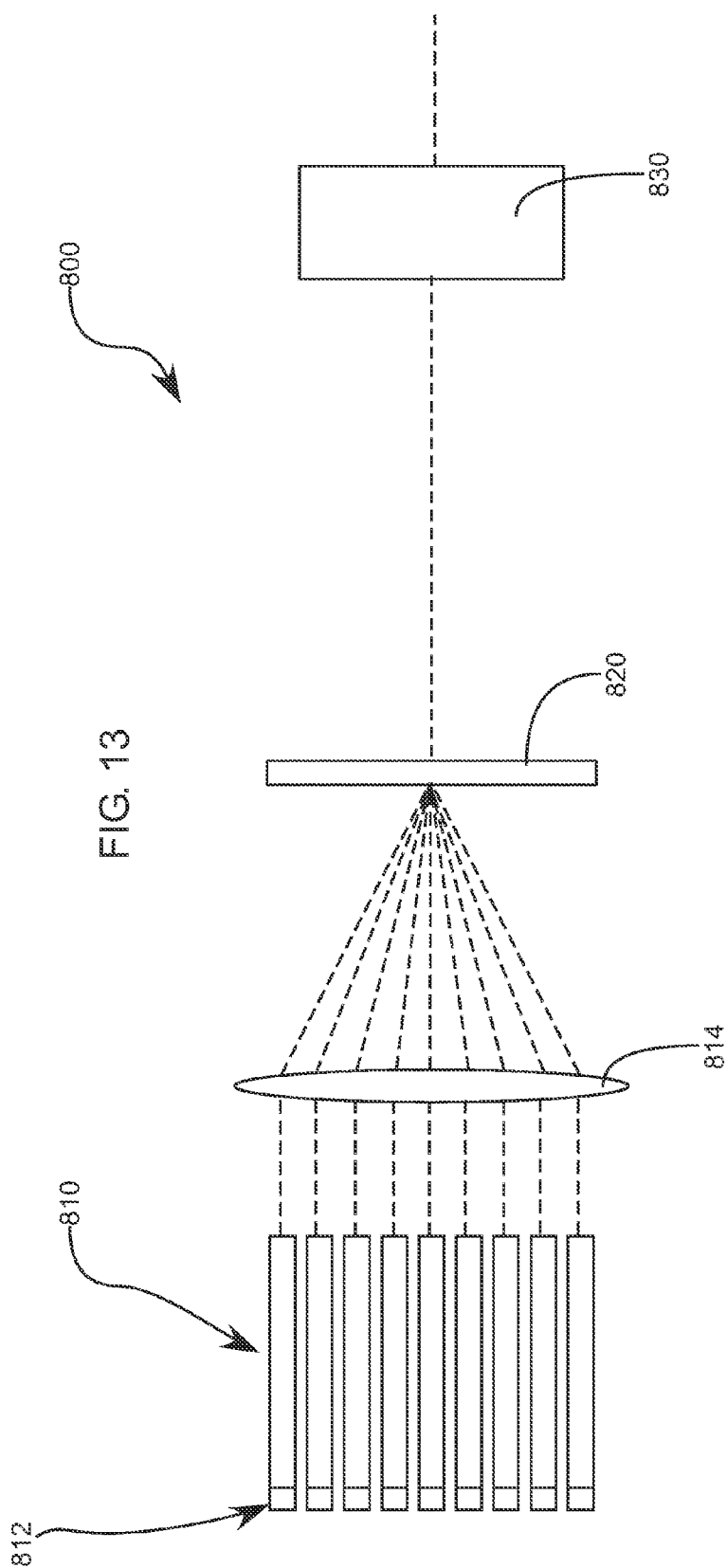

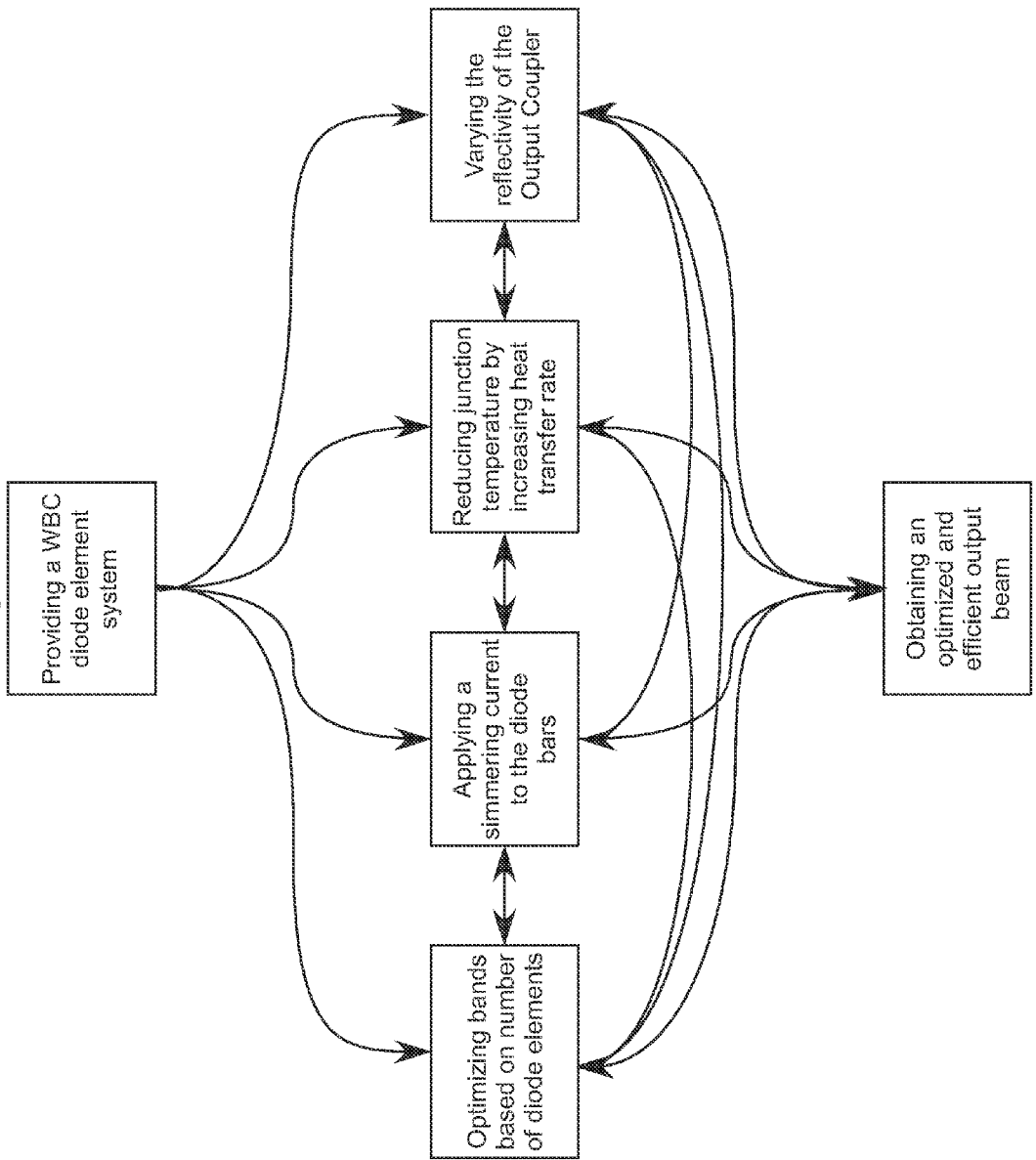

Wavelength Stabilizer Cavity

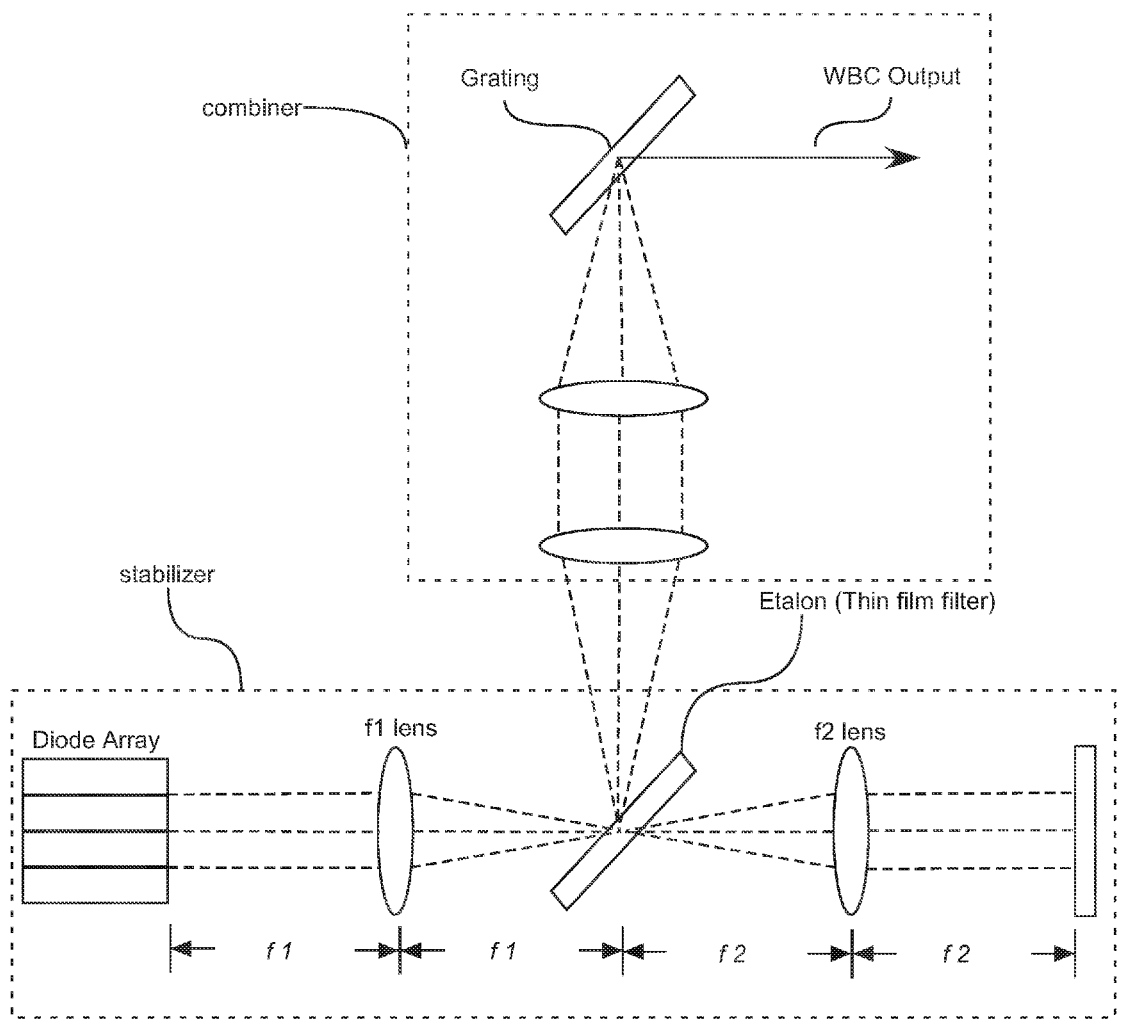

METHOD FOR IMPROVING PERFORMANCE OF WAVELENGTH BEAM COMBINING DIODE LASER SYSTEMS

PRIORITY CLAIMS

This application claims benefit to U.S. Provisional Patent Application No. 61/916,598 being filed Dec. 16, 2013, which is hereby incorporated by reference in its entirety.

COPYRIGHT INFORMATION

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present embodiments relate generally to Wavelength Beam Combining (WBC) systems and methods for improving the desired output power turn-on time.

2. Description of the Prior Art

When diode emitters or elements are used in WBC systems they have the advantage of generally being more efficient than all other types of lasers. However, if the diode elements or emitters are not chosen or designed properly the output power turn-on time can be slow, such as ranging from milli-seconds (ms) to several seconds. For material processing this not desirable and often the output power turn-on time needs to be in the micro-second time range. These challenges are compounded when an increased power or high-power output is desired that requires combining multiple emitters.

Applicant has recognized that diode emitters operating in WBC systems will encounter slow turn-on time output power if not designed properly. This turn-on time problem is due to the fact that when the laser system is turned on from zero output power to full operating power there is a large thermal induced gain shift at the junction of the diode emitters. At zero output power the junction temperature of the diode emitters is essentially the same temperature as the heat sink or coolant temperature. At the full operating power the junction temperature will increase. This change in junction temperature will shift the gain of the diode elements accordingly. If the shift of the gain peak is larger than the gain bandwidth of the diode elements than the output power turn-on time will be slow.

SUMMARY OF THE INVENTION

Disclosed is a method for fast turn-on time output power from a WBC laser system. The method can include using diode emitters at the optimized wavelength, optimized output coupler reflectivity, simmering the diode current, and reducing the junction temperature.

In another aspect of the present invention a method for achieving fast turn-on in output power from a WBC laser system is disclosed. This method can include a step of determining an optimal lasing wavelength for each and all diode emitters in the system. The optimal lasing wavelength for each diode emitter is determined by measuring the turn-on time and output power versus wavelength. After the optimal band or lasing wavelength region is determined for each diode emitter then an optimal placement within a system can be determined and placed accordingly.

To further improve the turn-on time of the system the reflectivity of the output coupler can be optimized. Usually the reflectivity needs to be increased. Increasing the output coupler increases the locking range of the diode emitters. By increasing the locking range of the diode emitters the usable band can be increased accordingly.

Another method of improving turn-on time of the diode emitters can be achieved by decreasing the change in junction temperature. This can be achieved by simmering of the diode elements. Simmering is the process of turning on the diode elements at or below lasing threshold. At or below threshold there is little or no output power. However, the junction temperature of the diode elements is hotter. Since the junction temperature is now hotter there is a smaller increase in temperature when the WBC system is starting from threshold to full operating power.

In another aspect of this invention, to achieve fast turn-on power the junction temperature of the diode elements needs to be decreased. With this decrease there is a smaller change in gain shift, and thus, a useable or more useable wavelength range with fast turn-on time can be achieved. The decrease in junction temperature can be achieved by better heat sink of the diode elements or lowering the operating power.

BRIEF DESCRIPTION OF THE DRAWINGS

FIG. 13 illustrates a WBC diode laser system having a plurality of heat sinks attached to each diode bar;

FIG. 14 illustrates a flowchart of the variables used to optimize the turn-on time for a WBC or similar system.

FIG. 17 illustrates and embodiment of a wavelength stabilizer/combiner system.

DETAILED DESCRIPTION OF THE PREFERRED EMBODIMENTS

Figure 1:
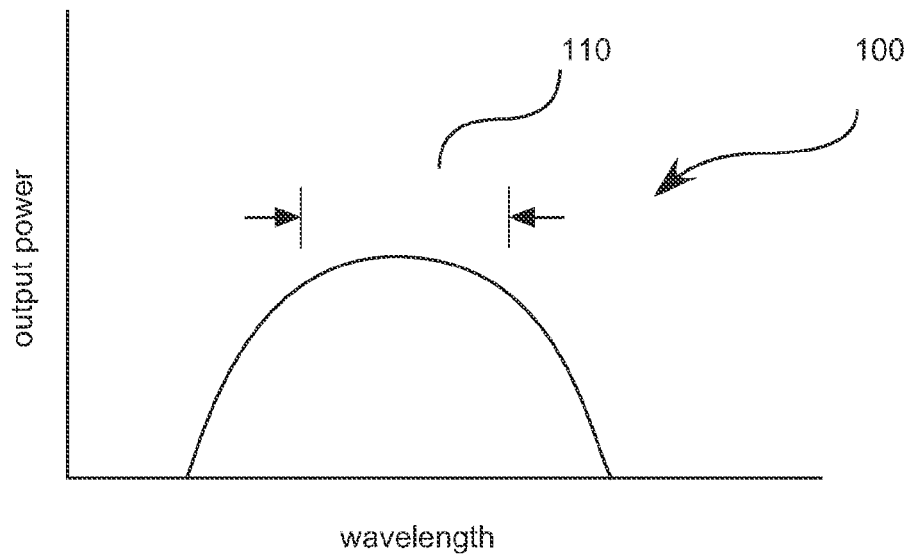
FIG. 1 illustrates a schematic showing output power versus wavelength of a diode emitter, where a portion of the bandwidth is marked as the optimal band region.

Aspects and embodiments relate generally to the field of creating a fast turn-on time WBC system through 1) predetermining the optimal positioning of diode emitters, 2) determining an optimal reflectivity for the output coupler, 3) selecting an appropriate simmer current, 4) and selecting an optimal operating junction temperature of the diode emitters.

For purposes of this application a diode element can refer to a diode bar or diode emitter. A semiconductor gain element can include any electromagnetic beam-generating device, but may or may not be self-resonating. These include quantum cascade lasers (QCL) or elements, vertical cavity surface emitting laser (VCSEL) or elements, diode elements and the like. Generally each emitter is comprised of a back reflective surface, at least one optical gain medium, and a front reflective surface. The optical gain medium refers to increasing the gain of electromagnetic radiation and is not limited to the visual, IR or ultraviolet portions of the electromagnetic spectrum. An emitter, may be comprised of multiple beam emitters such as a diode bar configured to emit multiple beams.

Stabilization of emitters refers to feedback received by each emitter that has been narrowed to a distinct wavelength. This may be in the form of seeding the emitters with a particular wavelength, causing a portion of the emitted beam to be redirected back into the emitter, and intervening with the feedback, such as placing an optical grating in the way, to produce a distinct wavelength to be directed into the emitters as feedback. Often times feedback is reflected back towards the original emission area, where it passes through a dispersive element or diffraction grating prior to entering back into the optical gain medium portion of the original emitter.

In some WBC embodiments, the feedback source may be a common reflective surface that provides feedback to a plurality of emitters, with each of the feedback beams being individually tuned to a particular wavelength.

One example of WBC system includes a one-dimensional (1-D) wavelength beam combining system consisting of a one-dimensional diode bar having a back reflective surface, a gain medium with two or more diode emitters, a front reflective surface, a combining optic, a dispersive element, and a partially reflecting output coupler. In this embodiment, the combining optic or lens is placed a distance away from the front reflective surface of the diode bar while on the back plane or other side of lens, dispersive element is placed a second distance away. The partially-reflective output coupler is placed at a certain distance from the dispersive element and reflects a portion of the generated beams (feedback) back towards dispersive element.

In this embodiment, the placement of the combining lens is done to accomplish two functions: The first function is to overlap all the chief rays from all the diode elements onto the dispersive element. The second function is to collimate each beam in both axes.

Applicant has recognized several problems which are often encountered when seeking to optimizing WBC systems. One such problem which often occurs is that when attempting to create an exceptionally efficient WBC diode laser system, that there can be large wait times between a cold start of the laser system and reaching full operational temperatures. Additionally, often these WBC diode laser systems fail to have sufficient operational power prior to reaching the full operational temperature. It has been recognized that operational power can be achieved more quickly if more or additional diode bars are introduced to the system, but as such additional diode bars can be problematic because the physical space is limited by the angle at which the emitted light can be directed toward the dispersive element or grating, and particular bandwidths are required for each angle of approach, and providing the appropriate bandwidth from each diode bar can become exceedingly burdensome.

Other methods of decreasing the heat up time can also include using an output coupler with a higher reflectivity, such that more light is reflected back into the system, which reduces heat up time. However, using the high reflectivity output coupler also decreases the overall Wall Plug Efficiency (WPE) greatly, i.e. the efficiency of the total output of the laser with regard to the power input from the "wall plug" or other power source. For this reason there is a balancing act between efficiency and heat up time.

Increased efficiency can be achieved for multiple diode bar systems by ensuring that each diode bar is working at its most efficient wavelength, i.e. the peak of a bandwidth intensity output curve, and ensuring that each diode bar is continually operating within an optimal bandwidth. The optimal bandwidth being defined as a bandwidth wherein the power output is within 5% of the maximum output at the peak of the bandwidth intensity curve.

For purposes of this disclosure, the term intensity as used herein, refers to the optical spectral intensity of a laser and is defined as a power per unit wavelength. The term spectrum refers to the optical intensity-wavelength profile of a laser beam. The term optimal band region is used to describe the region wherein the intensity of the laser is at least half the intensity i.e. full width at half maximum (FWHM), 1/e (0.368) and $1/e^2$ (0.135) of the maximum value.

WBC systems work by directing the output of multiple emitters onto a specified region of a dispersive element, such as a grating, to combine or overlap each of the beams. Feedback from the beams can be directed back into the each emitter source to stabilize the particular wavelength and lock it into the optimal position. However, as mentioned above, some diode bars have a particular band region that can work more effectively when positioned in the proper bandwidth region in a WBC system. that numerous positions.

Figure 2:
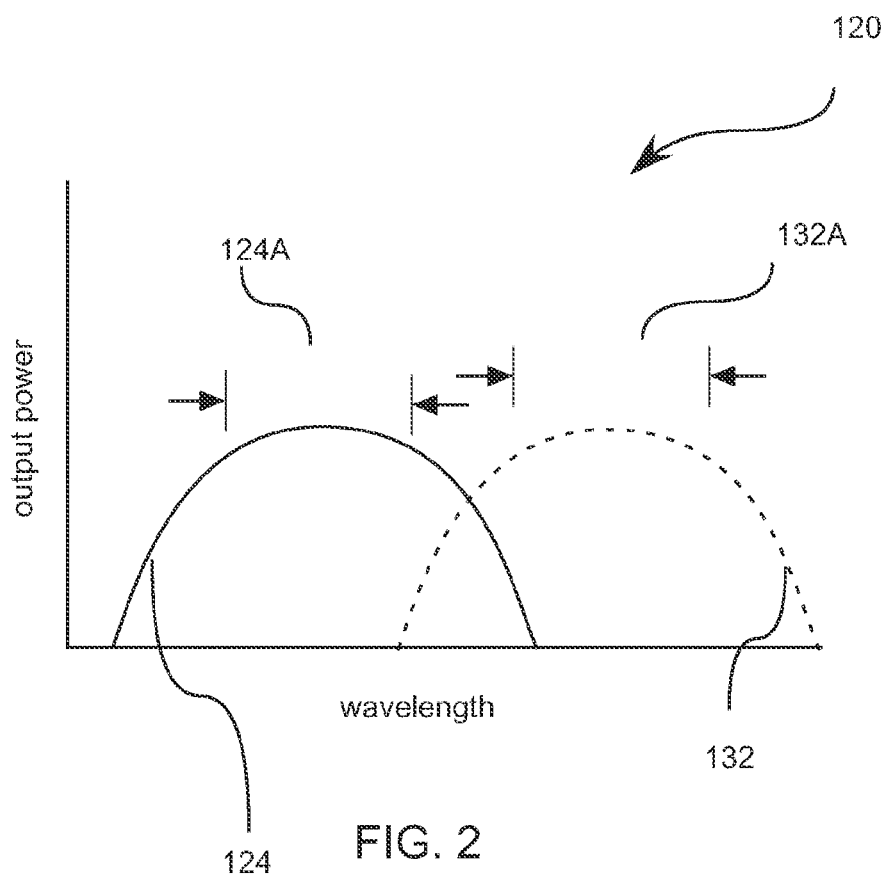
FIG. 2 illustrates the output power versus wavelength for two diode emitters, where a portion of each bandwidth is marked as the optimal band region.

For example, in one exemplary WBC system, nine diode bars in a 3×3 array are combined using a single grating device to form a high-power multi-wavelength output. Each of these diode bars is thus naturally physically located in a region separate from that of the others. As a result, the pure angle position used to combine the diode bars onto the grating is fixed and cannot be optimized. This results into the gain bandwidth of each bar being fixed in the WBC system. Power turn-on issues will arise if the diode bars are not placed with optimal gain band region as shown in FIGS. 1 and 2 the optical elements (or pure angled positioned) used to combine each of the diode bars onto the grating can often not be optimized. In other words, the wavelengths that the diode bar are eventually 'locked' or stabilized around can be on the edge of bandwidth of that particular diode bar and not contained within the 'optimal band region' as shown in FIGS. 1 and 2. By binning diode bars according to their optimal band regions and placing the binned diode bars in a physical position within a WBC system that is optimized for that particular designed for that particular diode bargain region, a more efficient system can be produced system without power turn-on issues can be produced. Additionally, alignment and stabilization problems can be reduced.

FIG. 1 illustrates a wavelength to intensity graph 100 of the output of a single diode emitter or diode bar, where a portion of the bandwidth is marked as the optimal band region 110. As shown, the optimal band region 110 is the portion of the gain band wherein the intensity is within a predetermined threshold value or percentage of the beam's maximum intensity value. It will be appreciated that a usable bandwidth range resides within the optimal band region 110 wherein if the diode bar resonates to and locks onto a bandwidth outside of this optimal band region a significant reduction in power will be realized which can often result in the diode bar ceasing to lase.

FIG. 2 illustrates a wavelength intensity graph 120 of the output of at least two diode emitters or bars, diode bar 124 and diode bar 132, where the optimal portions of each bandwidth are marked as optimal band 124A and optimal band 132A, respectively. As illustrated, the output spectra for diode bars 124 and 132 can overlap. In several additional embodiments, however, the optimal band portions of additional diode bars can overlap, thereby producing an output beam having an optimal band region effectively spanning a plurality of wavelengths.

Figure 3A:
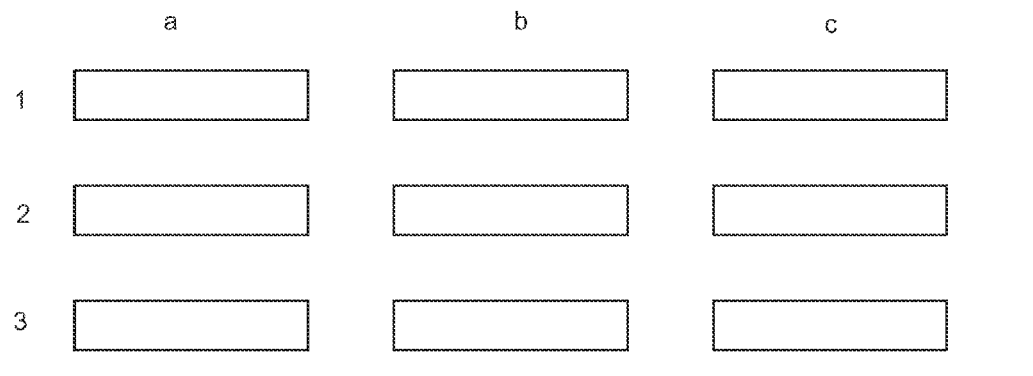
FIG. 3A illustrates a diode bar array having three rows and three columns.
Figure 3B:
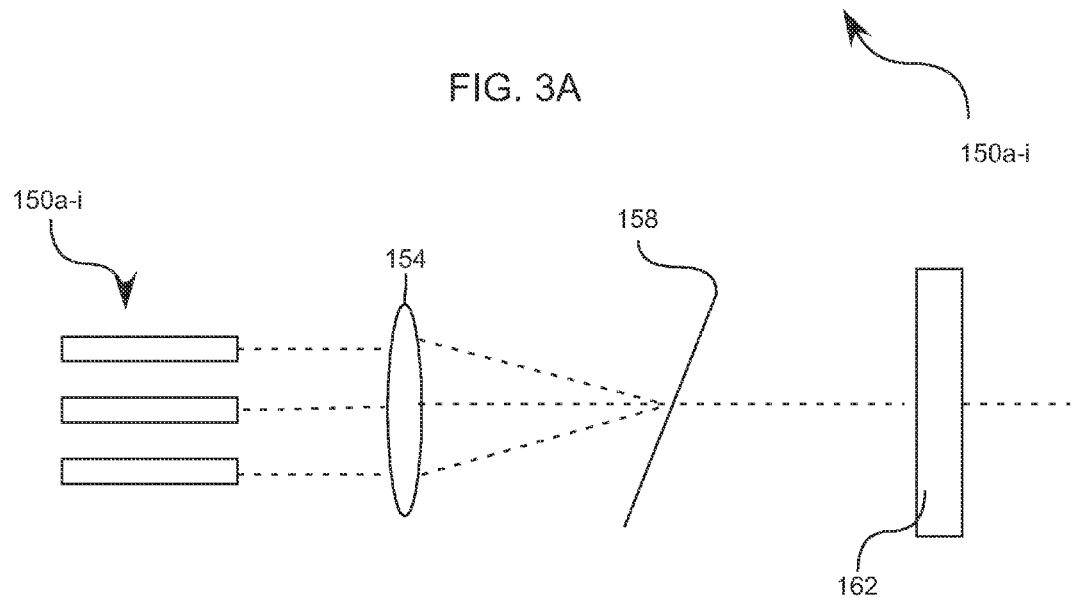
FIG. 3B illustrates one embodiment of a WBC system.

FIGS. 3A and 3B illustrate an embodiment where a plurality of diode bars 150a-i are placed in a 3×3 array comprising positions 1a-3c. In some methods herein, binning diode bars into 3 optimal band regions is sufficient to cover the necessary bandwidths for positions 1-3. However, in WBC systems which combine along more than one beam combining dimension, it will be appreciated that additional optimal band regions in wider spectrums will often be required.

As illustrated in FIG. 3B, at least one embodiment can include at 3×3 array of diode bars 150a-i. The diode bars have been binned or selected according to their optimal band regions and placed within the WBC system at an optimal physical location corresponding to their individual optimal band position. An optical element (or lens) 154 having a desired focal length can then be provided so as to focus the emitted beams at a desired location, for example onto a diffraction grating 158. Subsequently a partially reflective output coupler 162 can be provided and configured to extract a desired percentage of the beam from the system and reflect a desired percentage of the beam back in order to stabilize the wavelength emission of each individual diode bar.

The steps of optimizing the turn-on time of a WBC system using multiple diode bars can include a step of measuring the output power and turn-on time versus wavelength of each diode bar and using the measured output to determine the optimal band region of each diode bar. The useable bandwidth for each diode emitter or bar is dictated by the turn-on time requirement and output power. For example, if the turn-on requirement is several seconds then usually the useable bandwidth is the entire locking range. If the turn-on requirement is in the several micro second then the useable range can be a few nanometers. In order to ensure that each position within the diode bar array has an appropriate optimal band region, a series of bins corresponding to an appropriate optimal band for each given position within the array can be created and filled with diode bars matching the desired profile for each bin. As a series of diode bars are produced, each individual bar can be measured and binned according to the measured optimal band region. Thus matching the optimal band regions to a desired physical location within a WBC system is achieved by merely selecting diode bars from the appropriate bin for each given position within the array.

The steps of measuring the output of each diode bar and determining the optimal band region of the diode bar can be conducted using any conventional measuring and detecting methods commonly known in the art. The step of binning the diode bars according to the optimal band region can be conducted to satisfy the conditions, described herein, to produce the desired beam characteristics. In some embodiments, the step of binning the diode bars can be eliminated and the diode bars can be directly matched to a physical location in a WBC system based upon the determined optimal band region. In practice, however, most often a binning process would occur.

The method disclosed herein can maintain the operating region of the output bandwidth and wavelength of the entire system and output beam. Certain bandwidth ranges can be more desirable in certain applications over others. In some embodiments, the system can be configured to achieve desired output. The wavelength versatility can be important depending on the specific task the laser is used to perform. For example in welding, materials such as steel, copper, aluminum each have unique properties that can cause them to respond differently to the bandwidth, wavelength, and intensity of the beams used thereon. As disclosed herein, the diode bars be directly matched to a physical location in a WBC system based upon the determined optimal band region, wavelength, or desired intensity.

In additional embodiments, the system can be configured to increase the sensitivity and accuracy of its sensing capabilities. For example, variation in material characteristics or a difference in environment conditions can affect the sensitivity and accuracy of a system. Systems having a certain specified bandwidth range can be more effective in a certain gaseous environment, in dusty conditions, in liquids, or other environmental condition. It is contemplated the diode bars can be binned in a manner so as to account for the environmental conditions and produce a desired beam in light of those conditions.

The present application does not disclose every possible embodiment, but a variety of embodiments demonstrating the principles used to increase the power turn-on time, efficiency, reduce optical alignment time, and overall increase stability of the WBC system.

Figure 4:
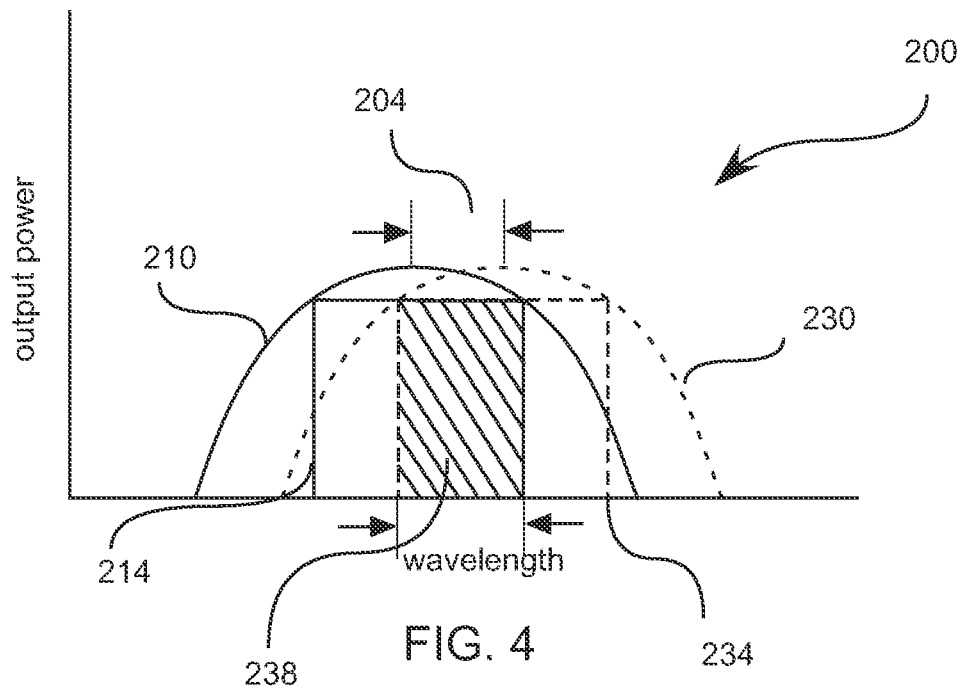
FIG. 4 illustrates the output power versus wavelength for two different operating junction temperatures (same applied current). The usable wavelength bandwidth range is effected by the thermal shift.

FIG. 4 illustrates a wavelength to intensity graph 200 of the output of a single diode emitter or bar. The arc 210 represents the gain bandwidth intensity curve of the diode bar at the operating current or power without any heat load, for example when operating the element with very low duty cycle but at the full operating current. The second arc 230 represents the bandwidth intensity curve of the same diode bar CW at the same operating current or power, for example the stable working temperature of the operating WBC diode laser system. The peak of the gain of the diode element or bar is shifted. This shift is proportional to the change in junction temperature.

FIG. 4 illustrates the same mechanism that occurs under a typical operating condition of a WBC laser system. In a typical operating condition of WBC laser the laser is turned on from zero current or zero operating power to full operating power. Thus, the gain peak of the diode element shifts. Applicant has determined that a certain degree of thermal shift 204 occurs which causes the optimal wavelength band of a particular laser diode to shift along the wavelength spectrum wherein a change in wavelength shows a proportional increase for a change in temperature, i.e. $\Delta\lambda\alpha\Delta T$. If the shift in the gain peak is larger than the locking range then the turn-on time can be very slow.

For example, a diode bar with a center wavelength of 976 nm experiences a thermally induced center wavelength shift expressed by the following equation:

$$\frac{\Delta \lambda}{\Delta T} = \frac{.3 \ nm}{C}$$

In this example, for every change in degree Celsius, a thermal shift in the bandwidth intensity curve will translate to approximately 0.3 nm either to the right or left in the graphical representation representing a shift upward or downward in the wavelength spectrum.

For purposes of illustration, if the cold junction temperature was 25 degrees Celsius and the junction operating temperature was 40 degrees Celsius, there would be a 4.5 nm translation of the bandwidth intensity curve. Depending on the geometry and design of the diode emitter or bar the locking range can be from few nm to 30 nm. In the case of 30 nm locking range the useable bandwidth where the diode emitter can be in order to turn on fast is a range of about 25.5 nm. In the case where the locking range is only a few nm, there would be no useable bandwidth where the diode emitter can be to turn on fast.

In this particular example the usable bandwidth range 238 is a subset of the optimal bandwidth, decreased by 4.5 nm. In other words the usable bandwidth is an area inside the optimal bandwidth range which is narrowed on one side by 4.5 nm. FIG. 4 illustrates this reduction when compared to FIG. 1, wherein optimal output range of curve 210 is represented by rectangular area 214, this would correspond to the bandwidth 110 shown in FIG. 1. However due to thermal shift, the laser diode bandwidth intensity output curve shifts to the right which results in a new optimal output range at the optimal operating temperature, the new optimal output range or thermally shifted range being represented by the rectangular area 234. The usable bandwidth is the intersection of these curves being represented by the hatched region 238.

It will be appreciated that a WBC laser diode system which is designed to have diode bar placements within each of the diode bar array positions, each of which correspond to their respective narrower usable bandwidth range, that the power output of each individual diode bar will be capable of being optimized for the entire operating temperature range, i.e. from a cold start, to a stable operating temperature.

In this manner, if the diode bar is chosen to operate in a particular location within a diode bar laser array, the position and corresponding optimum wavelength can be chosen to fall within the usable bandwidth range of the particular diode bar. In this manner, whether the WBC diode laser system is at an initialization temperature or at the operating temperature, all diode bars within the system will always be operating within 5% of the peak power output or whatever range is used to define the usability range. This essentially allows for the ability to design a system with a negligible difference between initialized temperature or a stable operating temperature with regard to power output, or in other words, a WBC diode laser system with zero or minimal warm up time.

Figure 5:
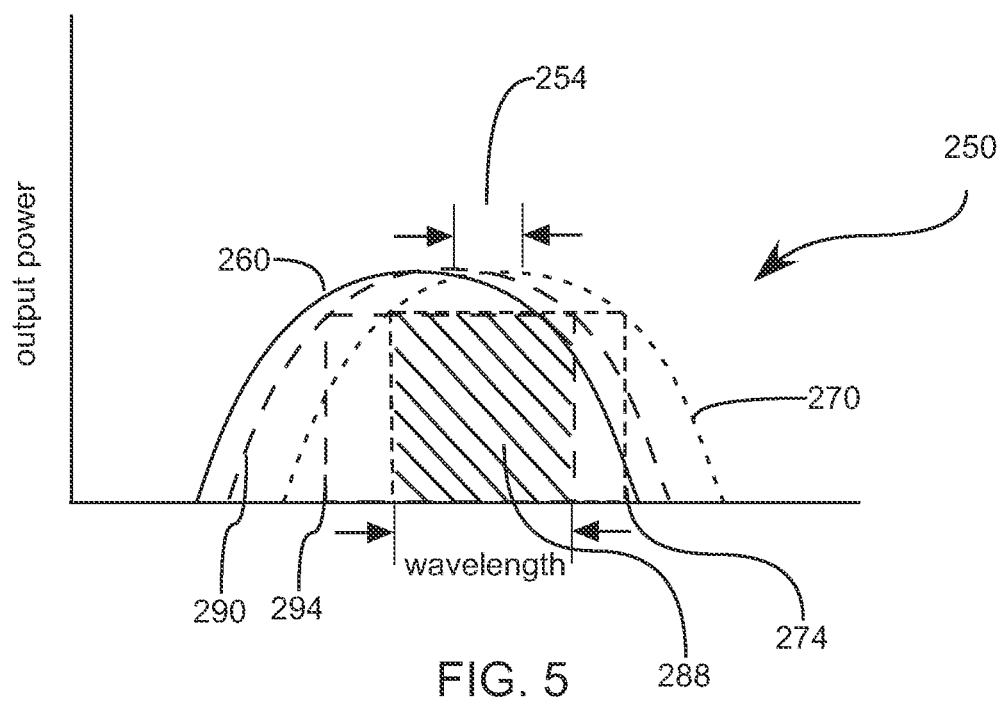
FIG. 5 illustrates the effect of introducing a simmer current to raise the initial starting junction temperature of the diode element as well as how a usable wavelength bandwidth range is effected by the reduced thermal shift.

Now with reference to FIG. 5, FIG. 5 illustrates a similar wavelength to intensity graph 250 of the output of a single diode bar. In this graphical representation the initial wavelength to intensity curve at room temperature is represented by curve 260, and the second operational temperature wavelength to intensity curve is represented by curve 270, wherein the optimal band region at the second operating temperature is shown by the area or span 274.

It has been recognized that by decreasing the temperature gradient 254 between the initial starting temperature and the second operational temperature, that a larger overlap between the two optimal band regions will be increased which results in a larger usable band region between the two temperatures. Using this principle, if a simmer current is applied to the diode bar, which allows for a preheating, or an increase of the first initial temperature, the temperature gradient 254 can then be reduced. Simmering current is usually defined as the current at or below threshold. Thus, at simmering current there is little or no output power from the laser system. Curve 290 represents the wavelength to intensity curve of a simmered diode bar, and the optimal band region of the simmered diode bar is 294. A larger overlap caused by the reduced temperature gradient provides a larger usable band region 288 between the two temperatures, which allows for increased efficiency of the diode bar across the entire temperature gradient for a selected or necessary bandwidth, which is largely dependent of placement within the diode bar array and the relative angel between each diode bar and the dispersive element.

Figure 6:
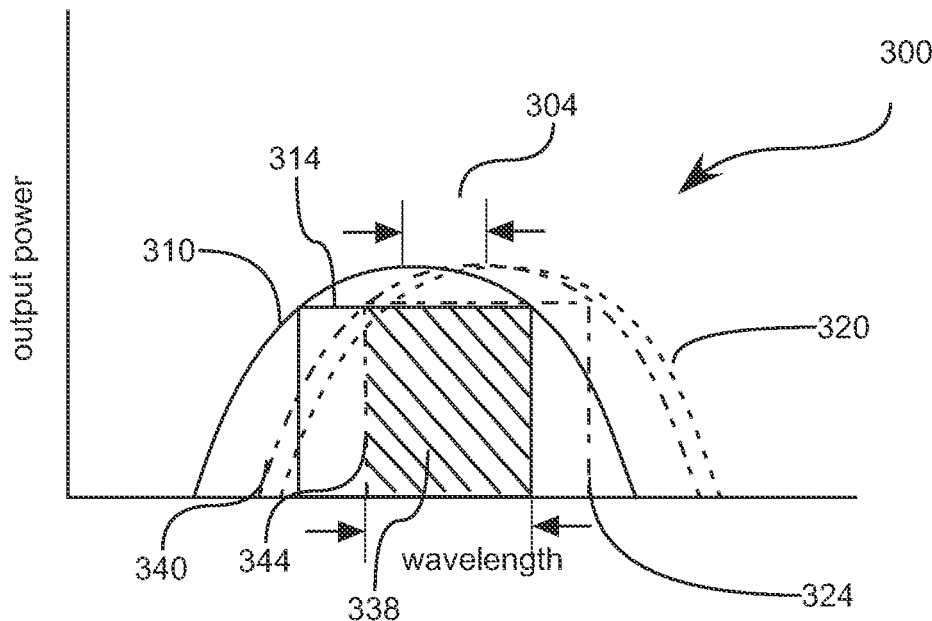
FIG. 6 illustrates the effect of reducing the operating junction temperature of the diode element on the wavelength intensity curve as well as how a usable wavelength bandwidth range is effected by the reduced thermal shift.

Now with reference to FIG. 6, FIG. 6 illustrates a similar wavelength to intensity graph 300 of the output of a single diode bar. In this graphical representation the initial wavelength to intensity curve at room temperature is represented by curve 310, and the second operational temperature wavelength to intensity curve is represented by curve 320, wherein the optimal band region at the first initial temperature, or room temperature, is shown by the area or span 274.

As discussed above, it has been recognized that by decreasing the temperature gradient 304 between the initial starting temperature and the second operational temperature, that a larger overlap between the two optimal band regions will be increased which results in a larger usable band region between the two temperatures. Using this principle, if a the second operational temperature can be reduced, by increasing the heat transfer coefficient of each diode bar, which removes heat more quickly, that the second operational temperature can be reduced, or by decreasing the operating current or operating power of the diode elements and the temperature gradient 304 can be minimized. Curve 340 represents the wavelength to intensity curve of a diode bar having added heat sinks or other heat dissipating devices attached thereto, which results in a decreased second operating temperature. In this manner the optimal band region of the diode bar at the operational temperature 344 overlaps more with the optimal band region of the diode bar at the first initial temperature 314, which allows for a larger overlap area, and thus a larger usable band region 344 between the two temperatures. Thus, by increasing the usable band region 344, the efficiency of the diode bar can be increased over the entirety of the temperature gradient 304.

Figure 7:
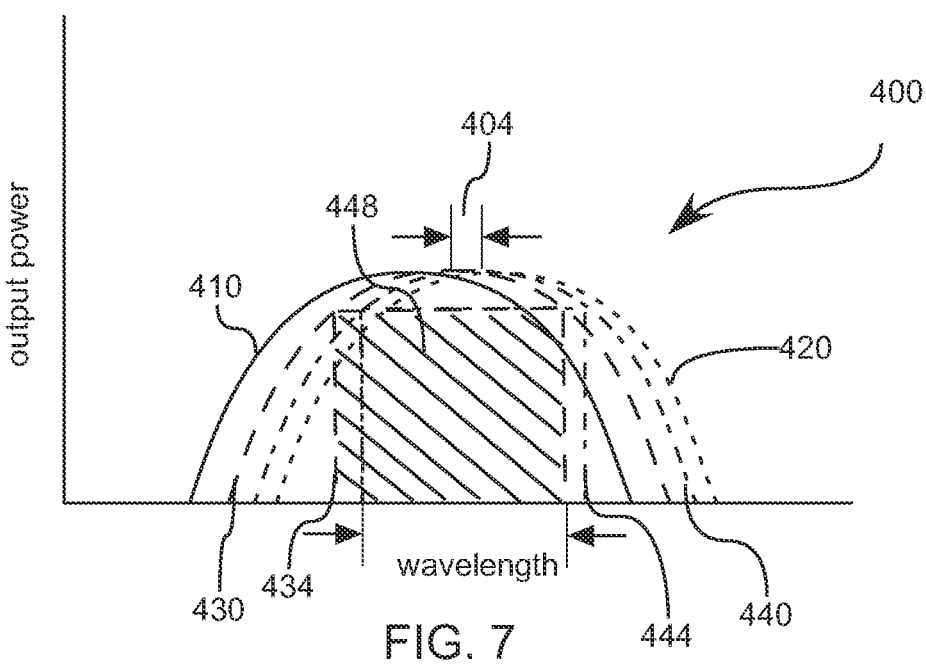
FIG. 7 illustrates how a combination of simmering and operating junction temperature reduction can affect the usable wavelength bandwidth range.

Now with reference to FIG. 7, FIG. 7 illustrates a wavelength to intensity graph 400 which illustrates the combination of the principles discussed in FIGS. 5-6. In this graphical representation the initial wavelength to intensity curve at room temperature is represented by curve 410, and a typical second operational temperature wavelength to intensity curve is represented by curve 420. However, in this representation both a simmer current, and an increased heat transfer coefficient or reduced operating current/power are both applied to the diode bar, wherein the curve 430 represents the wavelength to intensity curve of the diode bar with a simmer current being passed therethrough, and the curve 440 represents the wavelength to intensity curve of the diode bar having an additional or more efficient heat sink attached therethrough. The optimal band region at the simmered diode bar temperature is represented by the area 434, and the reduced operational temperature will result in the optimal band region represented by area 444.

By using the two principles in tandem, the temperature gradient 404 can be reduced even further than by either of the principles acting alone. In this manner, the overlap between the two optimal band regions 434 and 444 respectively, can be maximized and the usable band region 448 can be increased even further, allowing for even more efficiency across the entire temperature gradient 404.

Figure 8:
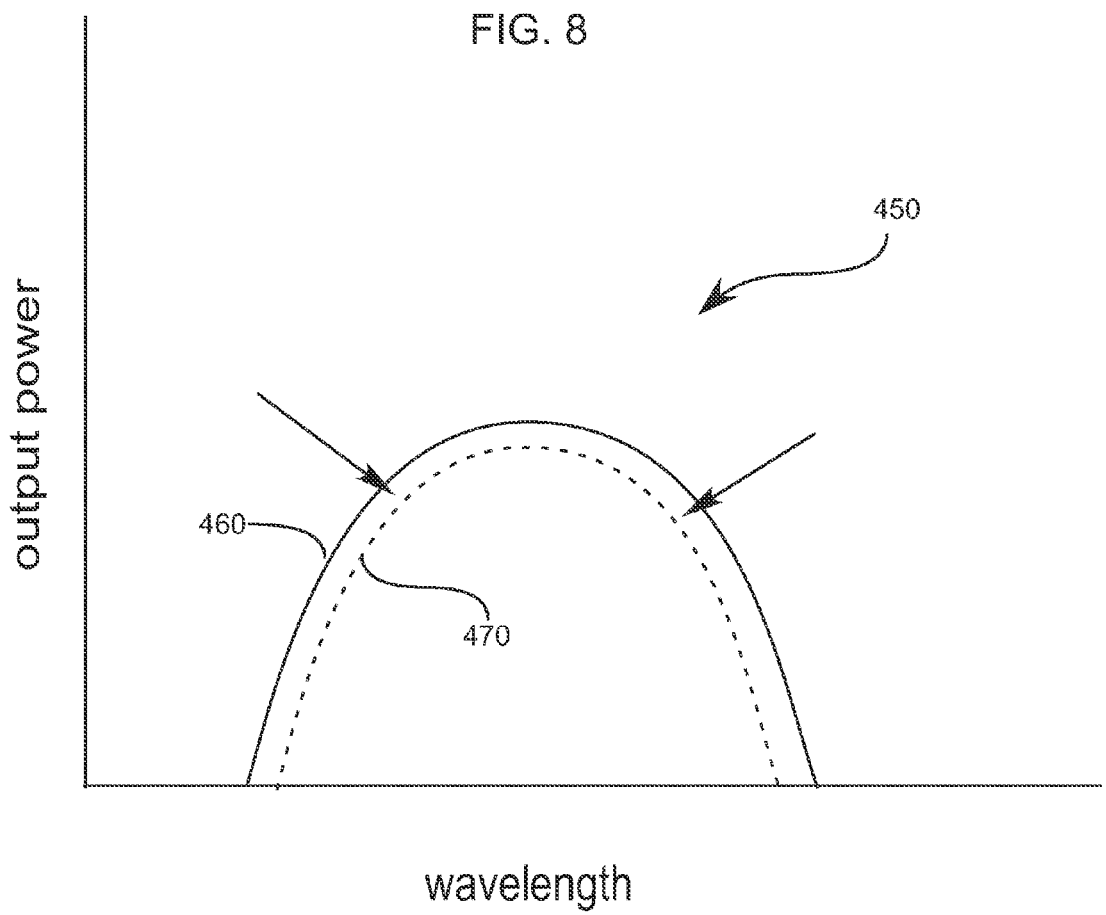
FIG. 8 illustrates the effect on the output power versus wavelength that is realized when changing the reflectivity of the output coupler.

FIG. 8 illustrates the effect of using a partially-reflective output coupler having two different reflectivity percentages on the wavelength to intensity curve of a diode element or bar. In this figure the curve 460 represents a typical wavelength to intensity curve of a diode bar using an output coupler having a higher reflectivity, for example 10% or above. Curve 470 represents the effect of using a lower reflectivity output coupler on the wavelength to intensity curve of the same diode bar. Thus, by increasing the output coupler reflectivity the locking range of the diode emitters is increased. By increasing the output coupler the useable bandwidth is increased accordingly. However, high reflectivity also results in decreased wall plug efficiency (WPE) for the entire system.

For the present invention, the startup time is being reduced by decreasing the temperature gradient rather than wasting energy to produce excess heat in order to span a larger temperature gradient. This being because the usable band region is being maximized by decreasing the temperature gradient. For this reason, the output coupler can be provided with a reduced reflectivity so long as the reflectivity provides sufficient overlap between the output intensity curves at the initialization temperature and the operating temperature.

In this manner a balance can be struck between usable band region and output coupler reflectivity such that an overall drop in peak output intensity does not drop below a desired threshold for a given desired wavelength while gaining the efficiency advantage of using a lower output coupler reflectivity.

Figure 9:
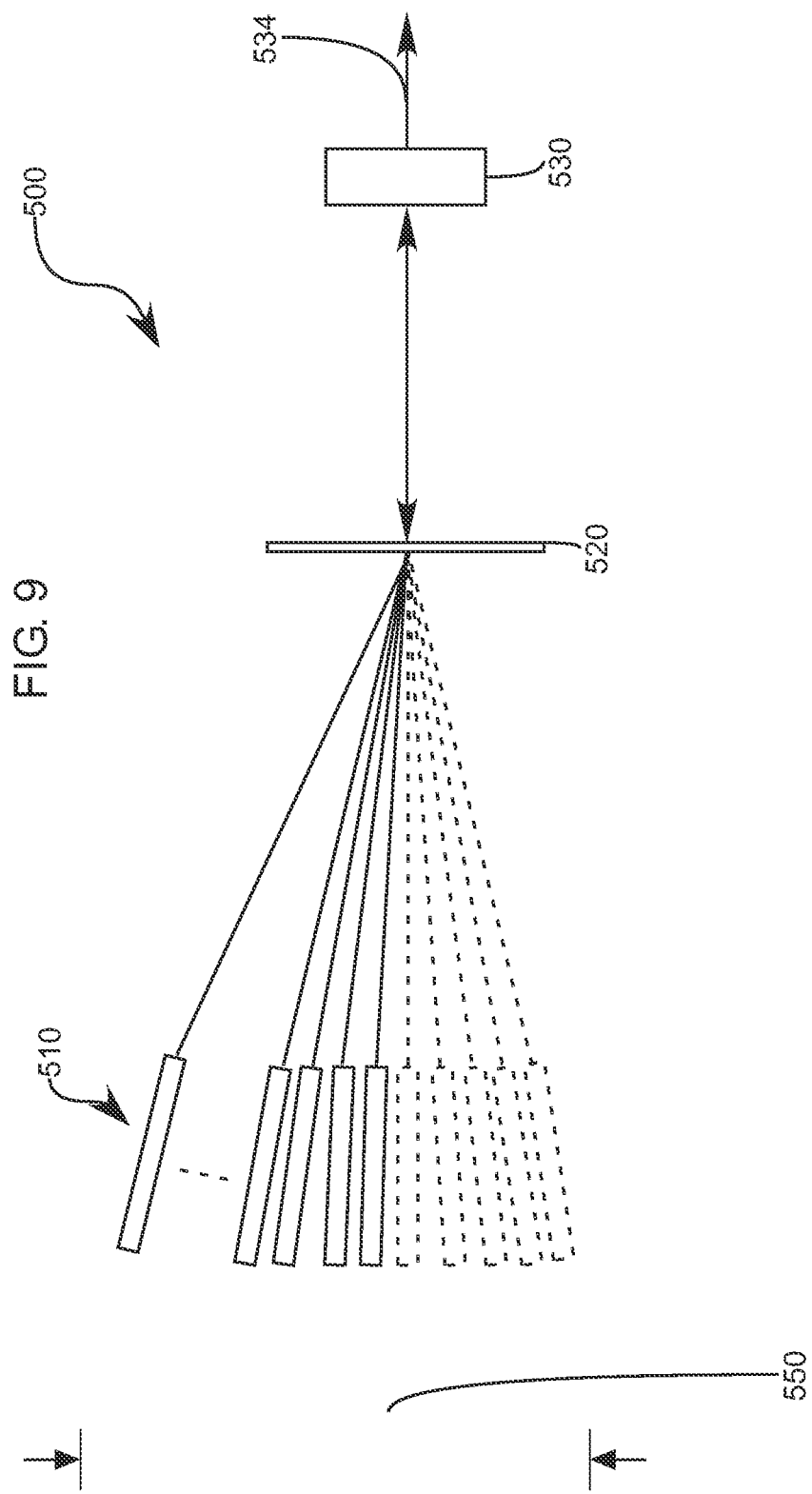
FIG. 9 illustrates the effect of diode angle with respect to the grating on the overall wavelength range of the system WBC diode laser system; 10 illustrates how a diode bar array can be configured in an arcuate, or angled shape so as to mechanically focus the beams on the grating.
Figure 10:
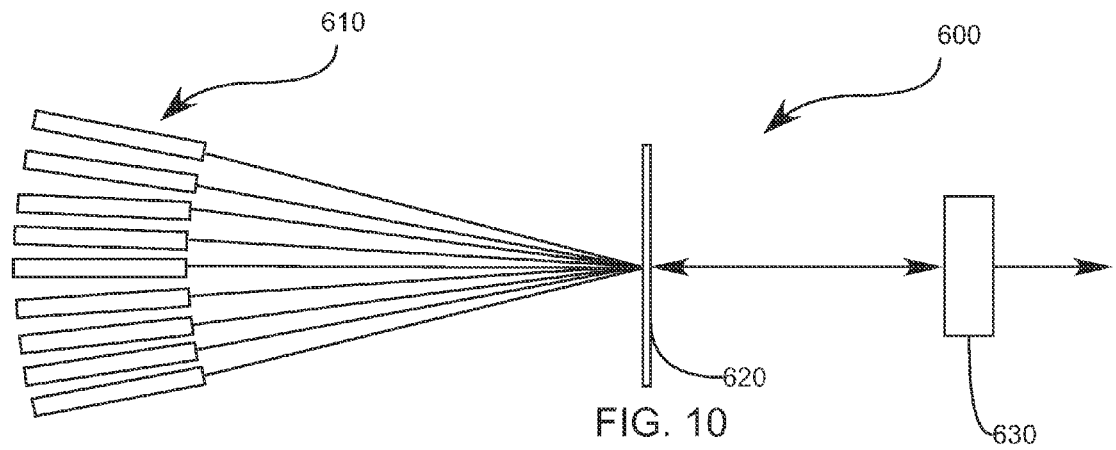

FIG. 9 illustrates a WBC diode laser system 500 having a diode bar array 510, a dispersive element 520, i.e. a grating or other suitable dispersive element, and a partially reflective output coupler 530. This system illustrates how the relative placement of the individual diode bars within the diode bar array 510 can have an effect on the total wavelength output of WBC diode laser system 500. The spectrum 550 is proportional to the range of the input angles of the various individual diode bars, wherein an increased range of the input angles also increases the spectrum 550 and thus the output spectrum of the combined laser beam 534. In the present embodiment, the spectrum 550 and corresponding output spectrum of the combined laser beam can be more than 20 nm. This range can be increased further, for example to 30 nm or more, so as to sufficiently to account for physical space requirements required to place the actual diode bars, which can be as low as 3-4 nm between each diode bar. For example a linear placement of 9 diode bars can require up to a 27 nm spectrum depending on physical arrangement FIG. 10 illustrates how the diode bars can be placed in a diode bar array 610 wherein the diode bars are mechanically configured to cause a chief ray from each diode bar to converge on desired point of the dispersive element 620 before being transmitted to the output coupler 630. The mechanical placement can result in a semi arcuate shape being provided to the diode bar array 610. It will be appreciated that the individual diode bars can be staggered radially outward from the arc so as to allow for closer compaction of the individual diode bars within the array.

Figure 11:
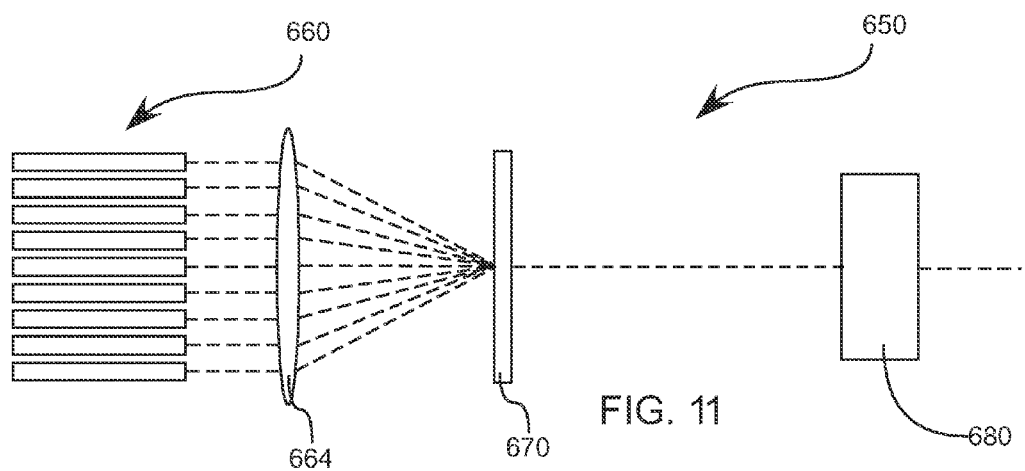
FIG. 11 illustrates how the diode bar array can be configured to optically focus each of the beams onto the grating.

FIG. 11 illustrates another embodiment of a WBC diode laser system 650, wherein the diode bars can be placed linearly within a diode bar array 660. Then using at least one optical lens 664 a chief ray from each individual diode bar can be caused to converge on the dispersive element 670 using optical means prior to transmission to the partially reflective output coupler 680.

It will be appreciated that cross coupling mitigation systems such as collimators as well as a plurality of optical elements and lenses can be used to achieve this optical convergence of the chief rays and mitigate cross coupling of reflected energy from the partially reflective output coupler 680.

Figure 12:
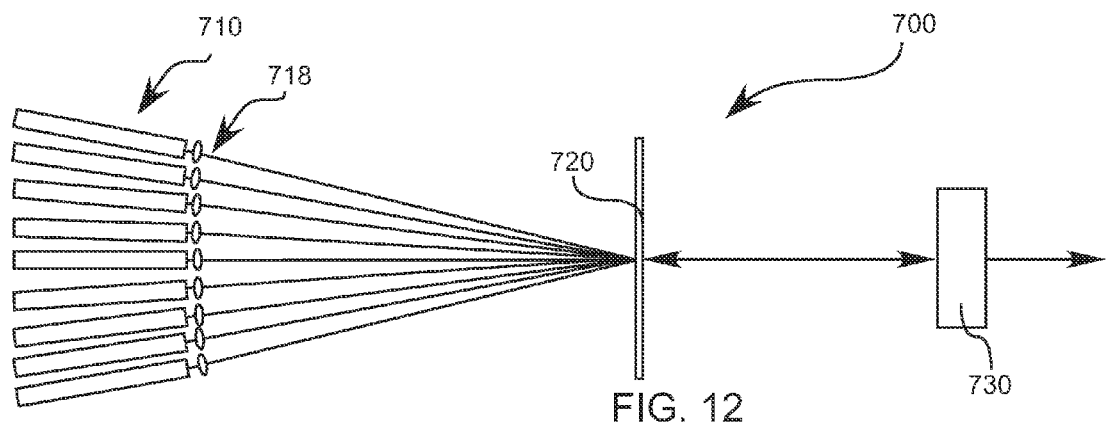
FIG. 12 illustrates how the WBC laser system can utilize one or more collimators to reduce beam degradation.

FIG. 12 illustrates a WBC diode laser system 700 having a diode bar array 710 wherein the energy from each of the individual diode bars is collimated prior to the dispersive element 720 and the partially reflective output coupler 730. It will be appreciated that a series of collimators 718 can be provided, one for each diode bar within the array, or alternatively a singular or unitary collimator can be provided which collimates the energy from the collective diode bar array.

FIG. 13 illustrates a WBC diode laser system 800 having a diode bar array 810, a combining optical element 814, a dispersive element 820, and a partially reflective output coupler 830. In this embodiment, a series of heat sinks 812 can be provided, such that a heat sink is provided to each of the individual diode bars within the diode bar array 810. In this manner, the final operating temperature of each diode bar can be reduced by increasing the rate at which heat is removed from the system.

It will be appreciated that the heat sinks can be provided as liquid coolers, or heat fins, piezoelectric coolers, or any other number of heat sinks recognized as capable of increasing the heat dissipation rate of solid object such as diode bar emitters.

FIG. 14 is a flowchart illustrating the variables that can be adjusted in order to optimize turn-on time of a WBC (or Wavelength Stabilizer/Combiner discussed below) system. The top of the flowchart is a box illustrating the type of system that is provided, here that is labeled as a WBC diode laser system, but could be a WBC QCL system, other WBC semiconductor laser system, Wavelength Stabilizer/Combiner system and so forth. The inputs or variables to adjust for this system include 1) optimizing the number and type of bands for the semiconductor gain elements (Diode bars, QCL, etc.), 2) determining an optimal simmering current for the semiconductor gain elements (ranging from zero to just below operating power), 3) an input for modifying or optimizing the junction temperature of the semiconductor gain elements by means of increased heat transfer, lower operating current, or combination thereof and 4) adjusting the reflectivity of the partially-reflective output coupler (or mirror in certain systems).

Wavelength Stabilizing Cavities

Figure 15A:
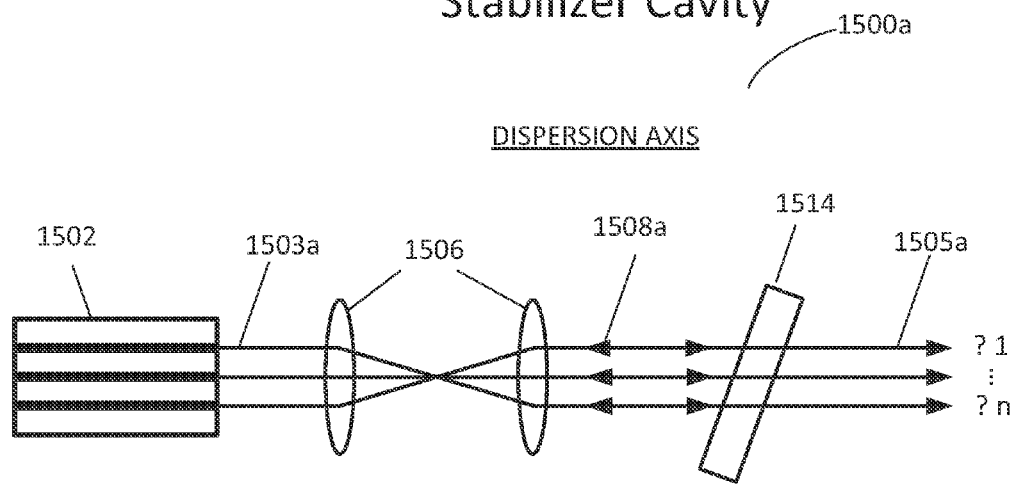
FIGS. 15A-B illustrates the Wavelength Stabilizer Cavity portion of a wavelength stabilizer/combiner system.
Figure 15B:
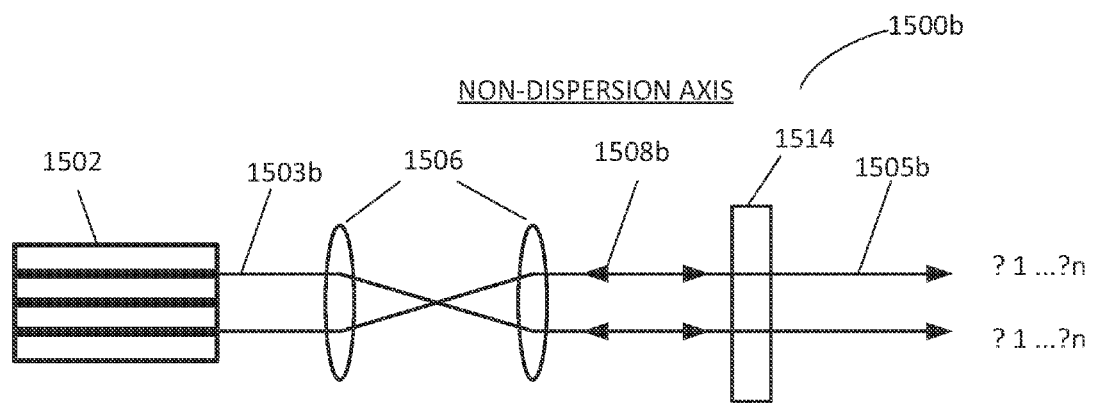

FIGS. 15A-B shows one embodiment for generating multi-wavelength-stabilized elements using a variation of the Littrow resonator. The embodiment uses a chirped grating 1514. In both dimensions, a single telecentric optic system 1506 is used. As shown, in its simplest form, the telecentric optics 1506 used comprise of a two-lens con-focal setup. The chirped grating 1514 may be a surface grating or volume Bragg grating. In this embodiment it is only chirped along one dimension, 1500*a*. In both the dispersive dimension 300*a* and non-dispersive dimension 1500*b*, the emitters 1502 have the same incidence angle onto the grating 1514. The diffracted beams 1508*a-b*, from each emitter is used as feedback to form a stable resonator. Since the grating 1514 is chirped each emitter is stabilized to a unique and defined wavelength by the resonator formed between the chirped grating 1514 and back reflective facet of each emitter (not labeled). The output beam 1505a is taken from the zero order of the grating 1514. The embodiment disclosed in FIGS. 15A-B and other embodiments describe below may include a multi-cavity system wherein multiple resonating cavities are created. These resonating cavities may include a back facet reflector formed on one end of a radiation element or emitter and any combination of or individual effective reflectivity of the front facet (not shown), dispersive element (or diffraction grating), partially or fully reflective mirror, and/or any other reflective optical element used in the system. Some of these reflective optical elements, such as the chirped grating shown in FIGS. 15A-B, act as a common reflector to multiple emitters, wherein a common system is created. This common system is one where multiple resonating cavities are created using the same reflective optical element in part to create their respective cavities. Thus, stabilizing each of the beams emitted by a plurality of emitters. The output 305a-b of the wavelength stabilizing system shown in FIGS. 3A-B may be the input to the wavelength beam combiner in FIG. 4.

Wavelength Combiners

Figure 16A:
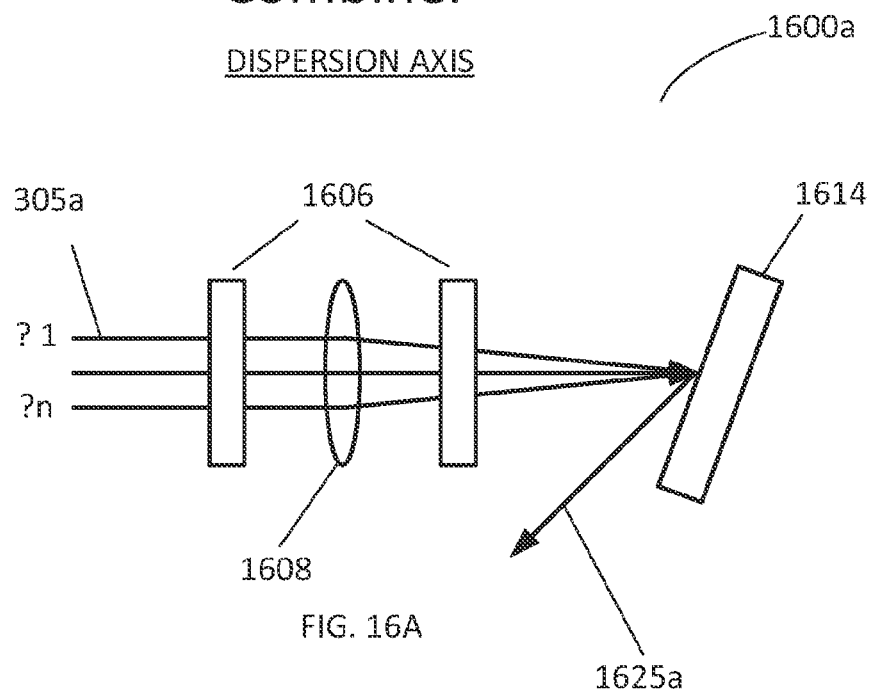
FIGS. 16A-B illustrates the Wavelength Combiner portion of a wavelength stabilizer/combiner system.
Figure 16B:
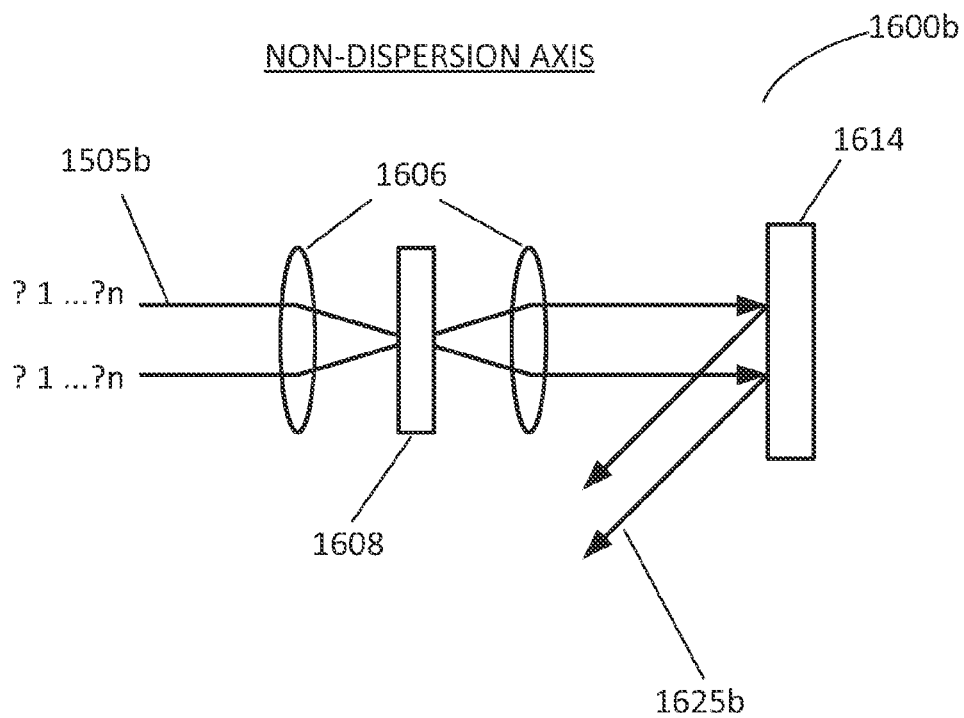

FIGS. 16A-B shows a wavelength and spatial beam combiner configured to receive the output 1505a-b from the wavelength stabilizer configuration shown in FIGS. 15A-B. Along the dispersion dimension 1600a, transform optic(s) 1606 and grating 1614 combine the output/input 1505a into a single beam as illustrated in FIG. 16A. Along the non-dispersion axis 1600b (FIG. 16B) telecentric optics 1606 comprised of cylindrical optics help reproduce the same incidence angle as the resonator from FIGS. 15A-B. As such, ideally, the optics will preserve the quality of input beam 1505b. Any deviations from this generally result in degradation of beam quality. These deviations include non-ideal matching of transform optics and grating combination, position of grating at other places/positions besides where the chief rays are overlapped, and non-telecentric optics along the non-dispersion axis. It should be noted in this configuration transform optic(s) 408 have power along the dispersion 1600a dimension to direct 1505a to converge towards 1614. Telecentric optics 1606 similarly only have power in the non-dispersion dimension 1600b. Output 1625 is then comprised of a combined multiple wavelength beam 1625a along the dispersion dimension 1600a while the output 1625b along the non-dispersion dimension maintains the original array or number of emission beams from a 2-D profile.

FIG. 17, is another embodiment of a Wavelength Combiner and Stabilizer Cavity system. Here a stabilizer cavity is formed of a diode array that transmits beams onto f1 lens, which focuses or combines the beams onto an Etalon or thin film filter. F2 receives the filtered beams and transmits the beams onto a mirror. The beams are reflected back through f2 onto the Etalon where a portion are retransmitted back into each of the emitters of the diode array, which causes a wavelength stabilization, while the remaining orders are transmitted onto the combiner portion of the Wavelength Combiner/Stabilizer system. Those beams transmitted to the combiner are collected, collimated and caused to converge on a grating where they are transmitted as a single output beam having a plurality of wavelengths.

The present methods of optimizing turn on time for a wavelength stabilizer/comber system as shown in FIGS. 15A-17 also apply.

In accordance with the aforementioned concepts, a method for achieving fast output power turn-on time for a WBC laser system is contemplated. This method can include measuring the output power and turn-on time versus wavelength of a plurality of diode emitters. Based on the optimal band region for each diode emitter, an optimal placement within a diode bar array, i.e. a placement having a specific angle and thus a required bandwidth emission can be determined. Depending on the useable or optimal band region the desired output coupler reflectivity can be designed to either decrease the useable band region, and thus increasing overall efficiency, or increase useable band region, and thus decreasing the overall efficiency.

As discussed briefly above, each of the diode bars can be positioning mechanically such that a chief ray from each diode bar converges on a focal point of the target optical grating other dispersive element. Alternatively, each of the diode bars can be optically positioned optical elements can cause a chief ray from each diode bar to converge on a focal point of the target optical grating or other dispersive element.

In the embodiments shown above, there are shown at least nine diode bars placed within the diode bar array. These diode bars can be arranged in various linear, arced, or grid-like configurations, in either adjacent or staggered configurations to more tightly place each diode bar.

In order to reduce the change in junction temperature of diode emitters a simmering current can be provided through the diode bars so as to increase the first initial temperature, thus reducing a total temperature gradient between the first initial temperature and the second operating temperature. Additionally, a heat sink can be provided about each diode bar and configuring or by reducing the operating current or power so as to reduce the optimal operating temperature and thus reduce a total temperature gradient between the first initial temperature and the second operating temperature in using an alternative approach. It will be further appreciated that these two methods can be used in combination so as to provide an even smaller total temperature gradient.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. It will be further appreciated that any of the above described features and principles can be applied in any number of suitable combinations and configurations. Accordingly, the foregoing description and drawings are by way of illustration and example only.

What is claimed:

1. A method for achieving desired output power turn-on time while maintaining optimal efficiency for a WBC laser system, the method comprising:

measuring the output power and turn-on time of a plurality of diode elements versus lasing wavelength, versus output coupler reflectivity, versus simmer current, and versus operating current or power;

determining an optimal output coupler reflectivity;

determining an optimal simmer current;

determining an optimal operating current or power;

determining an optimal band region for each diode element;

determining an optimal placement within an array of multiple diode elements and converging onto a common dispersive element, wherein the optimal placement of each diode element within the array of diode elements is based on the optimal band region for each diode element; and providing a partially reflective output coupler configured to receive an output beam from the dispersive element, the partially reflective output coupler configured to provide feedback to each of the plurality of diode elements and thus provide unique wavelength stabilization, the output coupler also being configured to transmit a single combined wavelength beam.

2. The method of claim 1, wherein the dispersive element is a diffraction grating.

3. The method of claim 1, wherein the output beam from the dispersive element is a diffracted first order.

4. The method of claim 1, wherein the turn-on time is less than 50 us.

5. The method of claim 1, wherein the turn-on time is less than several seconds.

6. The method of claim 1, further comprising:
positioning each of the diode elements by mechanically placing each diode element such that a chief ray from each diode element converges on the dispersive element.

7. The method of claim 1, further comprising:
positioning each of the diode elements by optically placing each diode element such that a chief ray from each diode element converges on the dispersive element.

8. The method of claim 1, wherein a diode element is a single diode bar or stack.

9. The method of claim 1, wherein the simmer current is above, at, or below a lasing threshold in the WBC system.

10. The method of claim 1, wherein the operating current is at or below a nominal operating current or power.

11. The method of claim 10, where is the nominal operating current or power is at a desired power for acceptable lifetime.

12. The method of claim 1, further comprising:
providing a collimating lens between each diode element and the dispersive element.

13. The method of claim 1, wherein the partially reflective output coupler has less than or equal to 10% reflectivity.

14. The method of claim 1, wherein the partially reflective output coupler has less than or equal to 4% reflectivity.

15. A method for achieving desired output power turn-on time while maintaining optimal efficiency for a wavelength beam combined laser system, the method comprising:

measuring the output power and turn-on time of a plurality of diode elements versus lasing wavelength, versus output coupler reflectivity, versus simmer current, and versus operating current or power;
determining an optimal output coupler reflectivity;
determining an optimal simmer current;
determining an optimal operating current or power;
determining an optimal band region for each diode element;
determining an optimal placement within an array of multiple diode elements and transmitting into a common wavelength stabilizer, wherein each diode element is locked to a unique wavelength by the wavelength stabilizer;
wherein the unique wavelengths transmit to a wavelength combiner, wherein the wavelength combiner transmits a single combined wavelength beam combined.

16. The method of claim 15, wherein the unique wavelength stabilization is achieved using an etalon.

17. The method of claim 16, wherein the optics consists of (i) an afocal system having first and second optics, and (ii) a reflecting mirror, and wherein the etalon is placed at a focal plane of the first optics of the afocal system and the reflecting mirror is placed at a focal plane of the second optics of the afocal system.

18. The method of claim 15, wherein the unique wavelength stabilization is achieved using a diffraction grating.

19. The method of claim 15, wherein the unique wavelength stabilization is achieved using an volume Bragg grating.

20. The method of claim 15, wherein the unique wavelength stabilization is achieved using an chirped volume Bragg grating.

21. The method of claim 15, wherein the combined wavelength beam is achieved using a transform optics and diffraction grating.

* * * * *